United States Patent
Bray

(10) Patent No.: US 7,154,254 B2
(45) Date of Patent: Dec. 26, 2006

(54) APPARATUS AND METHOD FOR IMPROVING ELECTROMAGNETIC COMPATIBILITY

(75) Inventor: David Michael Bray, Edinburgh (GB)

(73) Assignee: Agilent Technologies, Inc., Palo Alto, CA (US)

(*) Notice: Subject to any disclaimer, the term of this patent is extended or adjusted under 35 U.S.C. 154(b) by 214 days.

(21) Appl. No.: 10/871,131

(22) Filed: Jun. 18, 2004

(65) Prior Publication Data

US 2005/0280405 A1    Dec. 22, 2005

(51) Int. Cl.
   *G05F 3/04* (2006.01)
(52) U.S. Cl. ..................................... 323/312
(58) Field of Classification Search ............. 323/312; 307/105, 106, 112
   See application file for complete search history.

(56) References Cited

U.S. PATENT DOCUMENTS 5,959,372 A * 9/1999 Every ........................ 307/131
6,215,316 B1 * 4/2001 Xu ............................ 324/623
6,969,975 B1 * 11/2005 Mayer et al. ............... 323/207

FOREIGN PATENT DOCUMENTS

WO    WO 2006008322 A2 *    1/2006

\* cited by examiner

*Primary Examiner*—Adolf Berhane

(57) ABSTRACT

A method and apparatus for providing improved electromagnetic compatibility between a power source (20) and a switching element (22) in a switched mode power supply includes a device (24) for measuring an electrical variable, for example current, that fluctuates as the switching element (22) switches power received from the power source (20). A signal injector (28) is arranged to generate an electrical signal, for example current, of substantially the same amplitude, but opposite polarity, as the measured current, and to inject it between the power source (20) and the switching element (22) so as to tend to minimize fluctuations in the electrical variable.

20 Claims, 9 Drawing Sheets

APPARATUS AND METHOD FOR IMPROVING ELECTROMAGNETIC COMPATIBILITY

This invention relates to an apparatus and method for improving electromagnetic compatibility, particularly, though not exclusively, for conducted emissions, especially at lower frequencies.

BACKGROUND OF THE INVENTION

Many electronic circuits require pulsed supplies of power and various devices are known that take input power from a power source and provide appropriately pulsed output power. One example of such a device is a switched mode power supply, which utilizes one or more switching elements to generate the pulses that are output at the required frequency. The frequency is dependent on the design of the power supply and can be from approximately 100 kHz to 2 MHz. A duty cycle of the output pulses is dependent on the load of the power supply and the input voltage, and the amplitude of the current pulses can be several times the average input current.

It will be apparent that whenever a switching element is used to switch power appearing from an input power source, electromagnetic interference is generated that can be conducted back to the power source and cause interference. This can be particularly disadvantageous at radio frequencies, which can cause interference with radio communication systems.

Accordingly, it is known to use Electromagnetic Compatibility (EMC) filters between the power source and the switching elements, for example of the switched mode power supply devices, to filter out the emissions. The EMC filters are passive, with the filtering being carried out by various combinations of capacitors and inductors. The component values are selected so that the emissions are attenuated to meet the conducted emission requirements. Furthermore, the inductors have to operate with the peak currents without saturating. Therefore, as currents get higher and the frequencies get lower, the capacitor and inductor values must increase resulting in components that are physically larger, causing an increase in space requirements and costs.

BRIEF SUMMARY OF THE INVENTION

The present invention therefore seeks to provide a method and apparatus for improving electromagnetic compatibility, which overcomes, or at least reduces the above-mentioned problems of the prior art.

Accordingly, in a first aspect, the invention provides an apparatus for providing improved electromagnetic compatibility between a power source and a switching element that switches power supplied from the power source to provide a required frequency power supply, the power source and the switching element being coupled via a first power line at a supply potential and a second power line at a reference potential, the apparatus comprising a measuring device for coupling to at least one of the power lines between the power source and the switching element for measuring an electrical variable that fluctuates as the switching element switches power received from the power source, and a signal injector coupled to the measuring device and to at least one of the power lines for injecting an electrical signal thereto so as to tend to minimize fluctuations in the electrical variable.

According to a second aspect, the invention provides a method for providing improved electromagnetic compatibility between a power source and a switching element that switches power supplied from the power source to provide a required frequency power, the power source and the switching element being coupled via a first power line at a supply potential and a second power line at a reference potential, the method comprising the steps of measuring an electrical variable that fluctuates as the switching element switches power received from the power source, and a injecting an electrical signal into at least one of the power lines so as to tend to minimize fluctuations in the electrical variable.

The electrical variable may comprise voltage measured across the first and second power supply lines, voltage measured across the second power supply line and a ground reference potential or current measured through a component in the first power supply line.

In one embodiment, the measuring device may comprise a pair of measuring electrodes for coupling between the first and second power supply lines.

According to a further embodiment, the measuring device may comprise a pair of measuring electrodes for coupling between the second power supply line and ground reference potential. The measuring device and the signal injector may comprise an operational amplifier having a pair of inputs for coupling to the second power line and to ground reference potential, respectively, a pair of power inputs for coupling to the first and second power lines, respectively, and an output for coupling to ground reference potential for injecting the electrical signal thereto, thereby drawing power from the power lines in such a manner as to tend to minimize fluctuations in the voltage measured between the second power line and ground reference potential.

According to a still further embodiment, the measuring device may comprise a pair of measuring electrodes for coupling to a pair of electrodes of the component provided in the first power supply line.

In a further aspect, the invention provides a power supply system comprising a power supply, a switching element coupled to the power supply via a first power supply line at a supply potential and a second power supply line at a reference potential, and an apparatus as described above.

The power supply system may further comprise a passive electromagnetic filter provided between the power supply and the apparatus. The switching element may form part of a switched mode power supply device. The power supply system may further comprise an inductor provided in the first power supply line.

The electrical signal injected into at least one of the power lines may comprise voltage or may comprise current.

BRIEF DESCRIPTION OF THE DRAWINGS

Several embodiments of the invention will now be more fully described, by way of example, with reference to the drawings, of which.

DETAILED DESCRIPTION OF THE DRAWINGS

Figure 1:
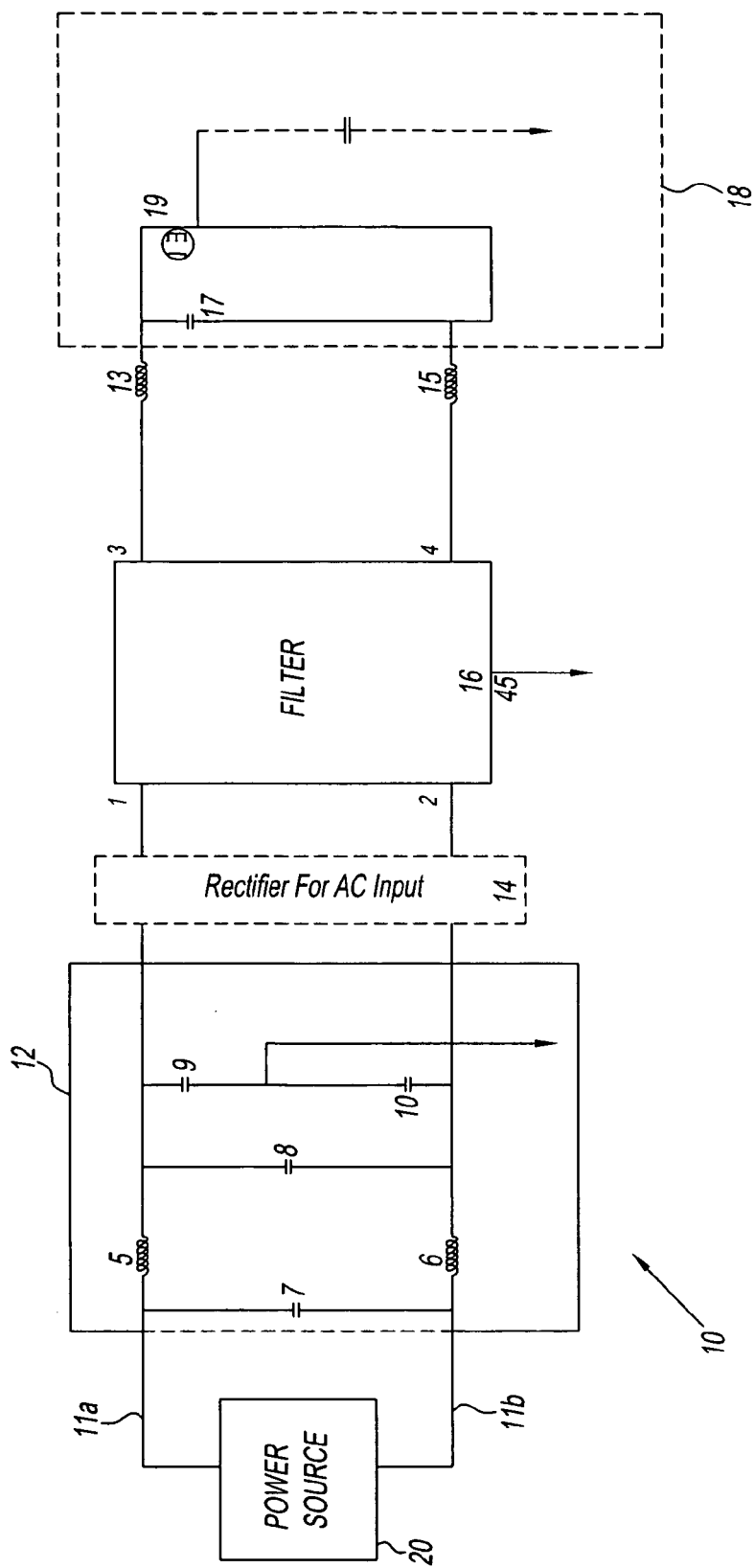
FIG. 1 shows a schematic block diagram of an apparatus incorporating the present invention.

Thus, FIG. 1 shows an apparatus 10 incorporating the present invention to reduce conducted emissions to improve Electromagnetic Compatibility.

A power source 20 provides electrical power to first and second power rails 11a, 11b. The power source may be alternating current (AC) or direct current (DC). The power rails 11a, 11b are coupled to an optional first EMC filter 12 of a type known in the art, which is usually a passive device. The filter 12 shown is a low pass filter, allowing transmission of low frequency signals and blocking higher frequency signals. The EMC filter 12 comprises inductors 5, 6 and capacitors 7–10, whose values are chosen such that the filter substantially achieves a desired response, in order to meet the EMC requirement set by national regulatory bodies.

The EMC filter 12 is coupled to a rectifier 14 if it is necessary to convert AC power into DC power. The rectifier may use half wave or full wave rectification as is known in the art. The rectifier 14 is coupled in series to inputs 1, 2 of an EMC filter 16 as will be further described below. The EMC filter 16 is coupled in series on the power rails, at inputs 1, 2 and outputs 3, 4; with point 45 being to a ground connection, if so desired.

The EMC filter 16 is coupled from outputs 3, 4 to an input of a typical switched mode power supply 18 via inductors 13, 15 provided on each of the power rails 11a, 11b, respectively. It is desirable for the inductors 5, 6, 13 and 15 to operate without saturating and therefore they must be able to cope with the peak currents transmitted on the circuit. As explained above, for large currents this would mean that inductors become physically large.

The switched mode power supply 18 would, typically, include a switching element 19, a transistor in this case, which would be the source of 'switching' noise that may propagate along the power rails 11a, 11b. Inductors 13 and 15, together with capacitor 17, which forms part of the switched mode power supply 18, form a first order low-pass filter which functions to reduce the amplitude of the current pulses to a level that the EMC filter 16 is capable of filtering, although it will be obvious to those skilled in the art that a different filter type and higher order could have been selected, and that the present invention is not limited to the topology shown. Known techniques such as image parameter or insertion loss methods may be used to design the filter and select the component values. The function of the EMC filter 16 is to monitor the 'switching' noise current created by the switching element 19 and then to generate a current of substantially the same amplitude but with substantially opposite polarity to that of the 'switching' noise current. The current generated by the EMC filter 16 is injected into the apparatus 10 so as to try to minimise the noise created by the switching element 19.

Figure 2:
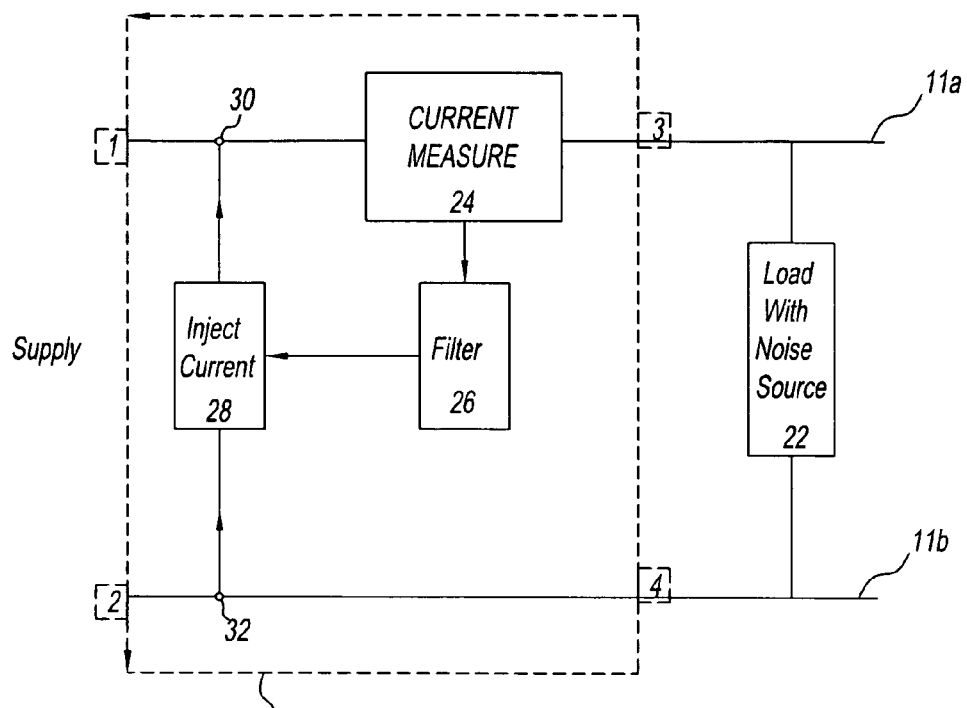
FIG. 2 shows a schematic block diagram of part of the apparatus of FIG. 1 according to a first embodiment of the present invention.

FIG. 2 shows a schematic block diagram of a first embodiment of the EMC filter 16 of the present invention. This embodiment utilises open loop filtering to try to achieve noise cancellation. The filter 16 of this embodiment is inserted into the apparatus of FIG. 1 as described above. A noise source 22 is shown in FIG. 2 and represents the switching element 19, capacitor 17 and inductors 13 and 15 of FIG. 1, which may generate noise on the first and second power rails 11a, 11b. A measurement device 24 is coupled in series on the first power rail 11a between input 1 and output 3 to monitor the current on the first power rail 11a and produce a measurement parameter proportional to the current flowing on the first power rail 11a. The measurement device 24 has an output coupled to a filter 26, the measurement parameter being passed to the filter 26, where any DC element is substantially blocked from passing through. The filter 26 may also filter the measurement parameter to a level which can be safely passed to a current source 28. Such filtering may be achieved passively. The filtered measurement parameter is coupled to the current source 28, which generates a cancellation current of substantially the same amplitude but with substantially opposite polarity to that of the 'switching' noise current measured in first power rail 11a. This cancellation current is injected into the first power rail 11a at point 30, with the return path for the current being from second power rail 11b at point 32, although, of course, the current on the first and second power rails will be 180 degrees out of phase with respect to each other.

Figure 3:
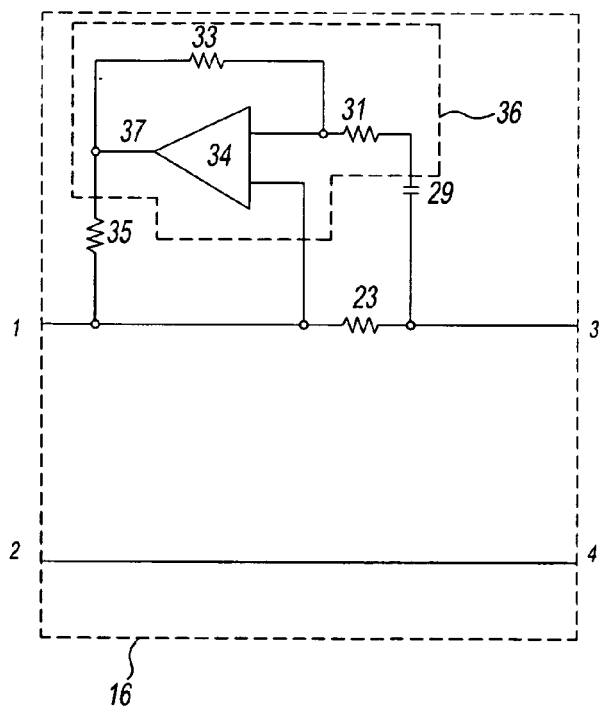
FIG. 3 shows a schematic circuit diagram of an implementation of the part of the apparatus shown in FIG. 2.

FIG. 3 shows a schematic circuit diagram of an example of circuitry implementing the embodiment of FIG. 2. The circuitry forming the EMC filter 16 is inserted into the apparatus 10 of FIG. 1 as described above. The circuitry monitors the switching noise on the first power rail 11a created by the switching element (19 of FIG. 1). This is achieved by resistor 23, coupled into the first power rail 11a. As will be clear to a person skilled in the art, as the current passing through the resistor 23 changes, so does the voltage across resistor 23.

The current source 28 is formed by an inverting amplifier 36 coupled to a capacitor 29, which, together with resistor 31 forms filter 26 and substantially prevents the DC component of the voltage developed across resistor 23 from entering the inverting amplifier 36. The inverting amplifier 36 comprises operational amplifier 34 and resistors 31 and 33. A non-inverting input (+) of the operational amplifier 34 is coupled to the first power rail 11a at the point the noise current exits the resistor 23. An inverting input (−) of the operational amplifier 34 is coupled, via resistor 31 to the second electrode of capacitor 29. Of course, in practice, the non-inverting input (+) of the operational amplifier 34 may also be capacitively coupled in a similar manner to that of the inverting input (−). Resistor 33 is coupled between an output 37 of the operational amplifier 34 and the inverting input (−) thereof to form a feedback loop.

The operational amplifier 34 is designed such that it attempts to maintain zero potential difference between its non-inverting (+) and inverting (−) inputs. In order to achieve this, the operational amplifier 34 adjusts its output voltage and utilises the feedback loop comprising resistor 33. However, the output voltage of the operational amplifier 34 is also applied to a resistor 35, coupled between the output 37 and first power rail 11a so that a cancellation current is injected through resistor 35 back into the first power rail 11a so as to produce a feedback loop between the output 37 and the non-inverting (+) input via the resistor 35. In this way, the inverting amplifier 36 responds to changes in the voltage across 23 due to 'switching' noise current and minimizes such changes.

The inverting amplifier 36 generates a voltage at its output that is n times the voltage across resistor 23. The value n is the gain of the amplifier and is given by the output voltage divided by the input voltage, the input voltages at both inputs being substantially the same, with the negative sign indicating that the voltage is approximately 180 degrees out of phase with the input voltage. This means that, for the inverting amplifier shown, the voltage gain is given by R2/R1, where R1 is the value of resistor 31 and R2 is the value of resistor 33.

In order to facilitate cancellation of the noise current, the amplitude of the cancellation current should be substantially the same as the noise current. The amplitude of the cancellation current can be adjusted by changing the value of resistor 35, such that when the value R3 of resistor 35 is n times the value R4 of resistor 23, then the cancellation and noise currents are substantially equal in value.

It will be appreciated that, although in practice the operational amplifier 34 will require a power supply, this has been omitted from FIG. 3 for clarity. Nevertheless, it will be appreciated that the power supply may be derived from the first and second power rails 11a, 11b or from elsewhere. When choosing the operational amplifier 34 it would be desirable to choose one with sufficient bandwidth.

Figure 4:
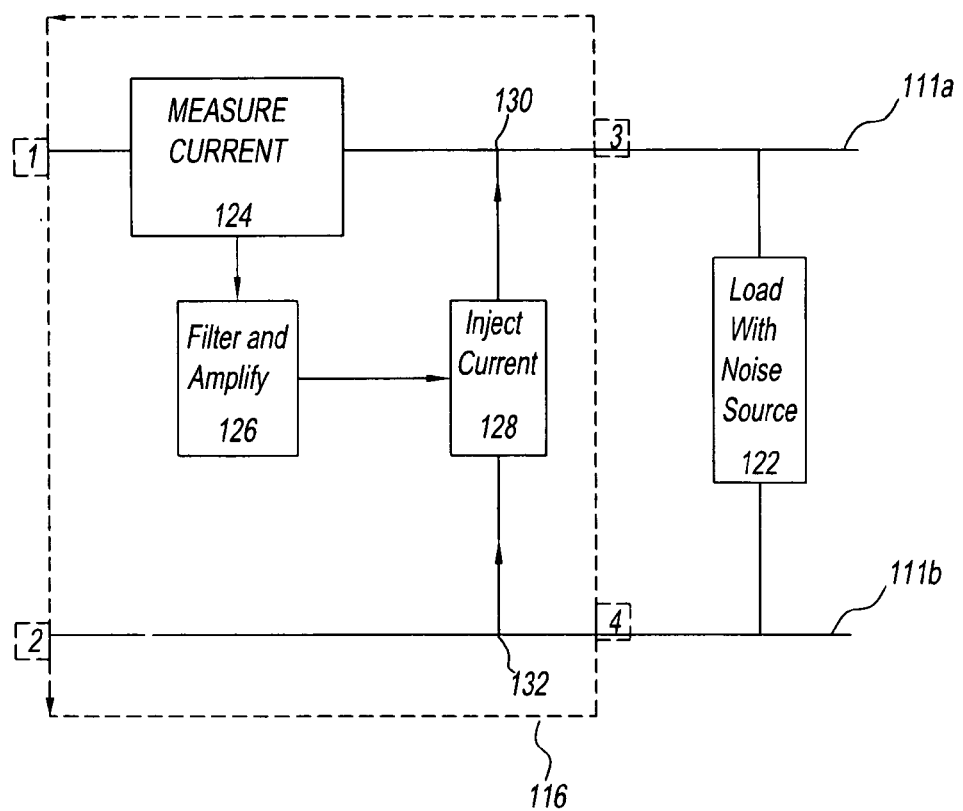
FIG. 4 shows a schematic block diagram of part of the apparatus of FIG. 1 according to a second embodiment of the present invention.

FIG. 4 shows a schematic block diagram of a second embodiment of an EMC filter 116 according to the present invention. This second embodiment utilises closed loop filtering to achieving noise cancellation. Once again, the circuitry forming the EMC filter 116 is inserted into the apparatus 10 of FIG. 1 as described above. Again, a noise source 122 is shown in FIG. 4 and represents the switching element 19, capacitor 17 and inductors 13 and 15 of FIG. 1, which may generate noise on the first and second power rails 11a, 11b. A measurement device 124, coupled in series on the first power rail 111a between input 1 and output 3, monitors the current on the first power rail 111a and produces a measurement parameter proportional to the current flowing on the first power rail 111a. The measurement device 124 has an output coupled to a filter 126, which substantially blocks any DC element passing through. The filter 126 also filters and/or amplifies the measurement parameter to a level which can be safely passed to a current source 128. This filtering may be achieved passively. The filtered measurement parameter of the noise current is then coupled to the current source 128 which generates a cancellation current of substantially the same amplitude but with substantially opposite polarity, 180 degrees difference, to that of the 'switching' noise current. This cancellation current is injected back into the first power rail 111a at point 130, with the return path for the current being from second power rail 111b at point 132.

As will be apparent, the difference between this embodiment and that of FIG. 2 is that the injection of cancellation current occurs before the point at which the noise current was measured. In this way the effect of adding the cancellation current is measured by the measurement device 124, thus creating a feedback loop such that the EMC active filter circuitry 116 monitors its own effect on the apparatus 10 shown FIG. 1.

Figure 5:
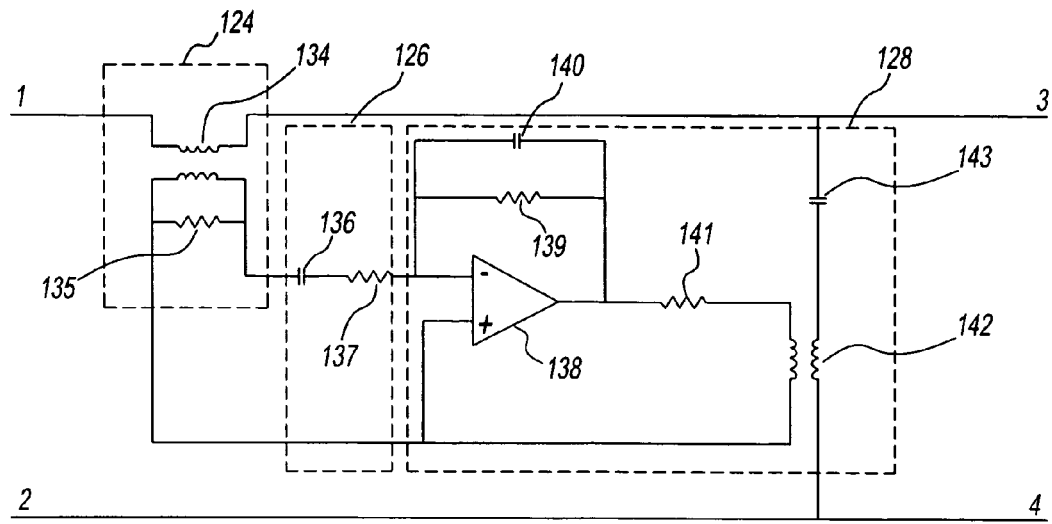
FIG. 5 shows a schematic circuit diagram of an implementation of the part of the apparatus shown in FIG. 4.

FIG. 5 shows a schematic circuit diagram of an example of circuitry implementing the embodiment of FIG. 3. The circuitry forming the EMC filter 16 is inserted into the apparatus 10 of FIG. 1 as described above. The circuitry monitors the switching noise on the first power rail 11a created by the switching element (19 of FIG. 1). This is achieved by transformer 134, coupled into the first power rail 11a and resistor 135. As will be clear to a person skilled in the art, as the current passing through the primary winding of transformer 134 varies, so does the induced current in the secondary winding of transformer 134. This causes the voltage across resistor 135 to change. The changing voltage is coupled, via capacitor 136, and resistor 137, to an inverting input of amplifier 138, the other side of the resistor 135 and transformer 134 being coupled to the non-inverting input of the amplifier 138. Resistor 139 and capacitor 140 are coupled in parallel between an output of the amplifier 138 and the inverting input (−) thereof to form a feedback loop. The output of the amplifier 138 is coupled, via resistor 141, to a primary winding of a second transformer 142, whose secondary winding is coupled, in series with capacitor 143, between the first and second power lines to inject current, as described above.

Again, it will be appreciated that, although in practice the operational amplifier 138 will require a power supply, this has been omitted from FIG. 5 for clarity. Nevertheless, it will be appreciated that the power supply may be derived from the first and second power rails 11a, 11b or from elsewhere. When choosing the operational amplifier 138 it would be desirable to choose one with sufficient bandwidth.

Figure 6:
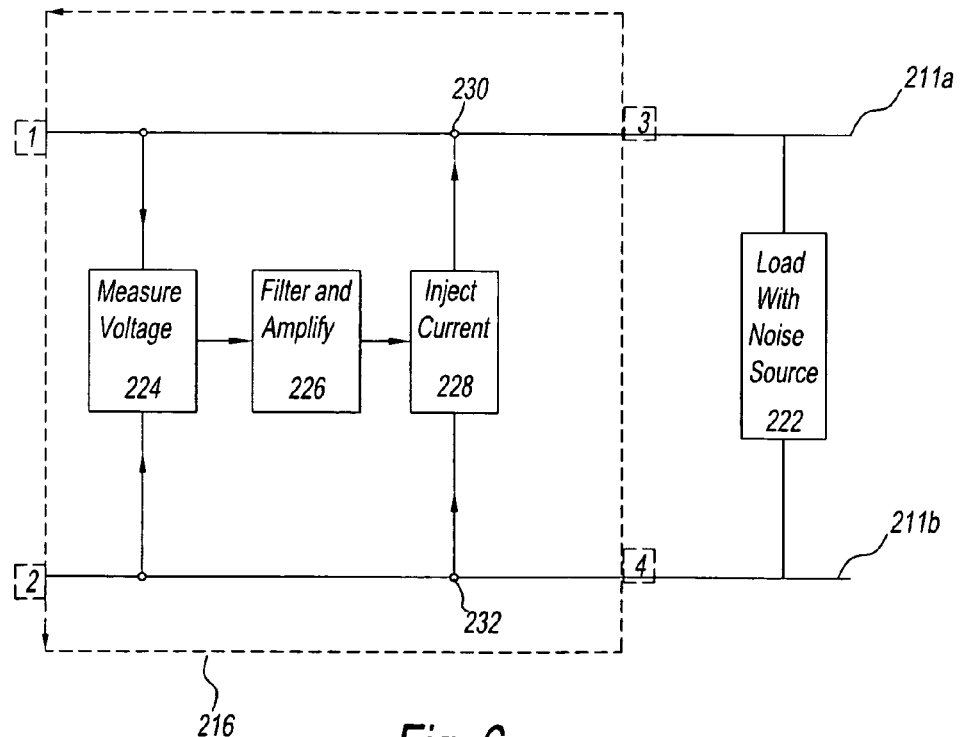
FIG. 6 shows a schematic block diagram of part of the apparatus of FIG. 1 according to a third embodiment of the present invention.

FIG. 6 shows a schematic block diagram of a third embodiment of an EMC filter 216. This third embodiment again utilises closed loop filtering to achieving noise cancellation, although it may be worked in an open loop configuration similar to that of the first embodiment of FIGS. 2 and 3. Again, the circuitry forming the EMC filter 216 is inserted into the apparatus 10 of FIG. 1 as described above. The noise source 222 created by the switching element 19, capacitor 17 and inductors 13 and 15 of FIG. 1 generates noise on the first and second power rails 211a, 211b. A measurement device 224 coupled in parallel between the first power rail 211a and the second power rail 211b monitors the voltage between the first power rail 211a and the second power rail 211b and produces a measurement parameter proportional to that measured voltage. The measurement device 224 has an output coupled to a filter 226, which substantially blocks any DC element passing through. The filter 226 also filters and/or amplifies the measurement parameter to a level which can be safely passed to a current source 228. This filtering may be achieved passively. The filtered measurement parameter of the noise current is then coupled to the current source 228 which generates a cancellation current of substantially the same amplitude but with substantially opposite polarity, 180 degrees difference, to that of the 'switching' noise current. This cancellation current is injected back into the first power supply rail 211a at point 230, with the return path for the current being from second power rail 211b at point 232.

The injection of cancellation current occurs prior to the point at which the noise current was measured. In this way the effect of adding the cancellation current is measured by the measurement device 224, thus creating a feedback loop such that the EMC filter 216 monitors its own effect on the apparatus 10 shown FIG. 1.

The embodiments described thus far have been aimed at reducing the differential mode conducted on the power rails, wherein noise emission occurs between the power rails generated by the switching element 19, capacitor 17 and inductors 13 and 15 of a switched mode power supply.

Figure 7:
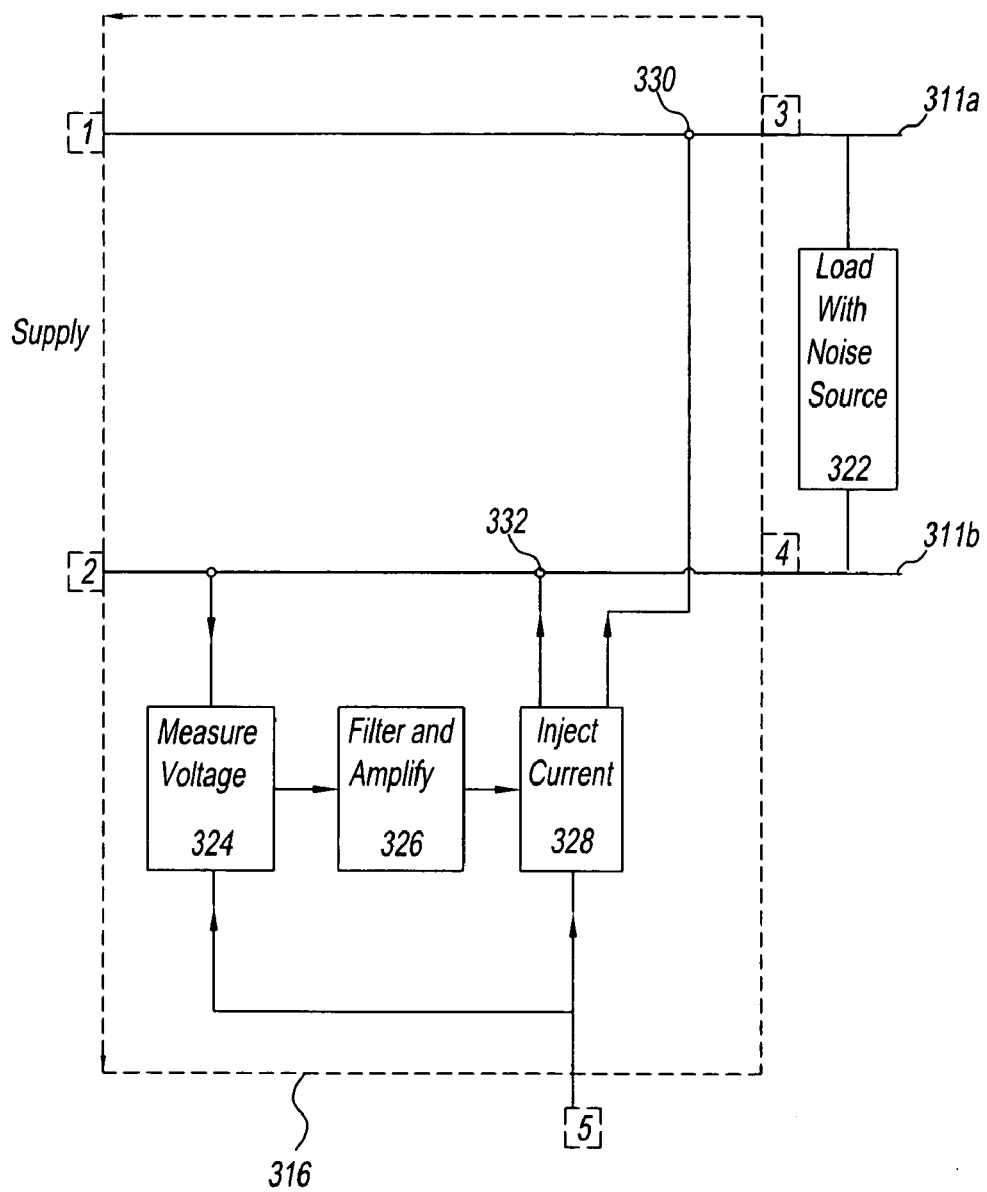
FIG. 7 shows a schematic block diagram of part of the apparatus of FIG. 1 according to a fourth embodiment of the present invention.

FIG. 7 illustrates a schematic block diagram of a fourth embodiment of an EMC filter 316 according to the present invention aimed at reducing common mode conducted noise emissions. In common mode, the noise emission occurs between the power rails with respect to ground (or Earth) connection. This embodiment again utilizes closed loop filtering to achieving noise cancellation, although it may be used in an open loop configuration similar to the first embodiment described above with reference to FIGS. 2 and 3. Again, the circuitry forming the EMC filter 316 is inserted into the apparatus 10 of FIG. 1 as described above. The noise source 322 created by the switching element 19, capacitor 17 and inductors 13 and 15 of FIG. 1 generates noise on the first and second power rails 311*a*, 311*b*. A measurement device 324 coupled between the second power rail 311*b* and a reference potential, which may be ground or any other reference potential, monitors the voltage between the second power rail 311*b* and the reference potential, and produces a measurement parameter proportional to that voltage. The measurement device 324 has an output coupled to a filter 326, which substantially blocks any DC element passing through. The filter 326 also filters and/or amplifies the measurement parameter to a level which can be safely passed to a current source 328. This filtering may be achieved passively. The filtered measurement parameter of the noise current is then coupled to the current source 328 which generates a cancellation current of substantially the same amplitude but with substantially opposite polarity, 180 degrees difference, to that of the 'switching' noise current. This cancellation current is injected back into the input power rail 311*a* at point 330, current may also be injected into the return power rails 311*b* at point 332 or both may be used. If the cancellation current is injected only into one power supply rail, AC coupling between the power rails may achieve cancellation of common mode emission on the other rail. In this case, the return path for the current is via the ground reference potential connection 5.

Again, the injection of cancellation current occurs prior to the point at which the noise current was measured. In this way the effect of adding the cancellation current is measured by the measurement device 324, thus creating a feedback loop such that the EMC filter 316 monitors its own effect on the apparatus.

Figure 8:
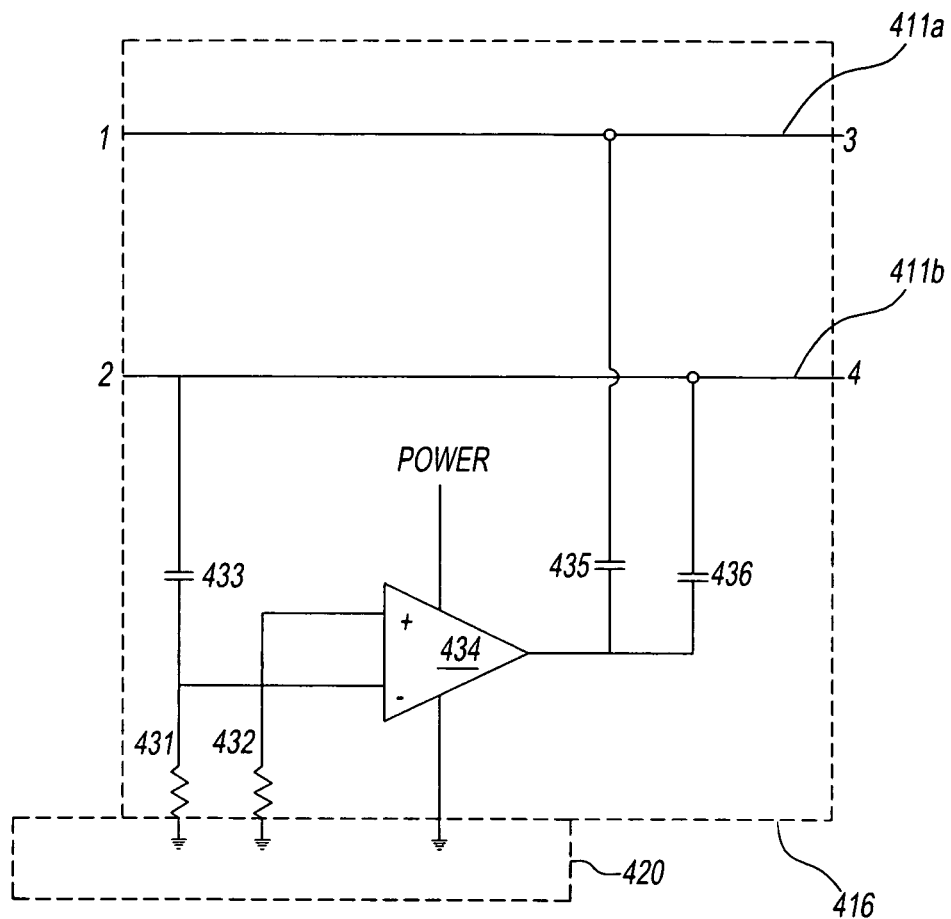
FIG. 8 shows a schematic circuit diagram of an implementation of the part of the apparatus shown in FIG. 7.

FIG. 8 shows a schematic circuit diagram of an example of circuitry implementing the embodiment of FIG. 7. The circuitry forming an EMC filter 416 is inserted into the apparatus 10 of FIG. 1 as described above. The EMC filter 416 monitors the switching noise between a first power rail 411*b* and a reference potential, such as ground, created by the switching element 19 capacitor 17 and inductors 13 and 15 of FIG. 1. The operational amplifier 434 is part of a feedback loop coupled to the second power rail 411*b*. The operational amplifier 434 has a non-inverting input (+) coupled to ground reference potential 420 via a resistor 431 and to the second power rail 411*b* via a capacitor 433. An inverting input (−) of the operational amplifier 434 is to ground reference potential 420 via a resistor 432. Capacitor 433 substantially blocks DC current from entering the operational amplifier 434.

An output 436 of the operational amplifier 434 is coupled to the first power rail 411*a* via a first capacitor 435. The output of the operational amplifier 434 is also coupled via a second capacitor 436 to the second power rail 411*b*. In practice, capacitors 435 and 436 may be Y class capacitors, as known in the art, the advantage of this type of capacitor being that they do not create a short circuit if they breakdown. The value of the capacitors would also in practice be restricted to maintain any leakage current below a specified level to meet safety standards set by national regulatory bodies. The operational amplifier 434 has two further connections to provide a power supply for the operational amplifier 434, one of which is a connection to ground reference potential 420, and the other being to one of the power rails 411*a*, 411*b* or some other source of power.

The operational amplifier 434 attempts to maintain zero potential difference between its inverting and non-inverting inputs (+,−). The potential at the non-inverting input (+) is, of course, fixed since it is connected to ground reference, whilst that of the inverting input (−) will be dependent on changes in electrical current on the second power rail 411*b*. The operational amplifier 434 therefore tries to minimize the difference between its inputs (+,−) by adjusting its output voltage. Since the capacitor 435 will, in practice, have some resistance, this output voltage is converted to a current which is fed back to the second power rail 411*b*. The feedback loop allows the operational amplifier 434 to monitor, and further adjust the current on the second power rail 411*b* so as to minimize the difference between the voltage on the second power rail 411*b* and the ground reference potential 420. The overall effect is to make the capacitor 435 appear to the second power rail 411*b* to have a larger value than it actually has, thereby minimising common mode conducted noise emission. Whilst this embodiment has been illustrated using closed loop filtering it is envisaged that open loop filtering could be used in alternative.

Figure 9:
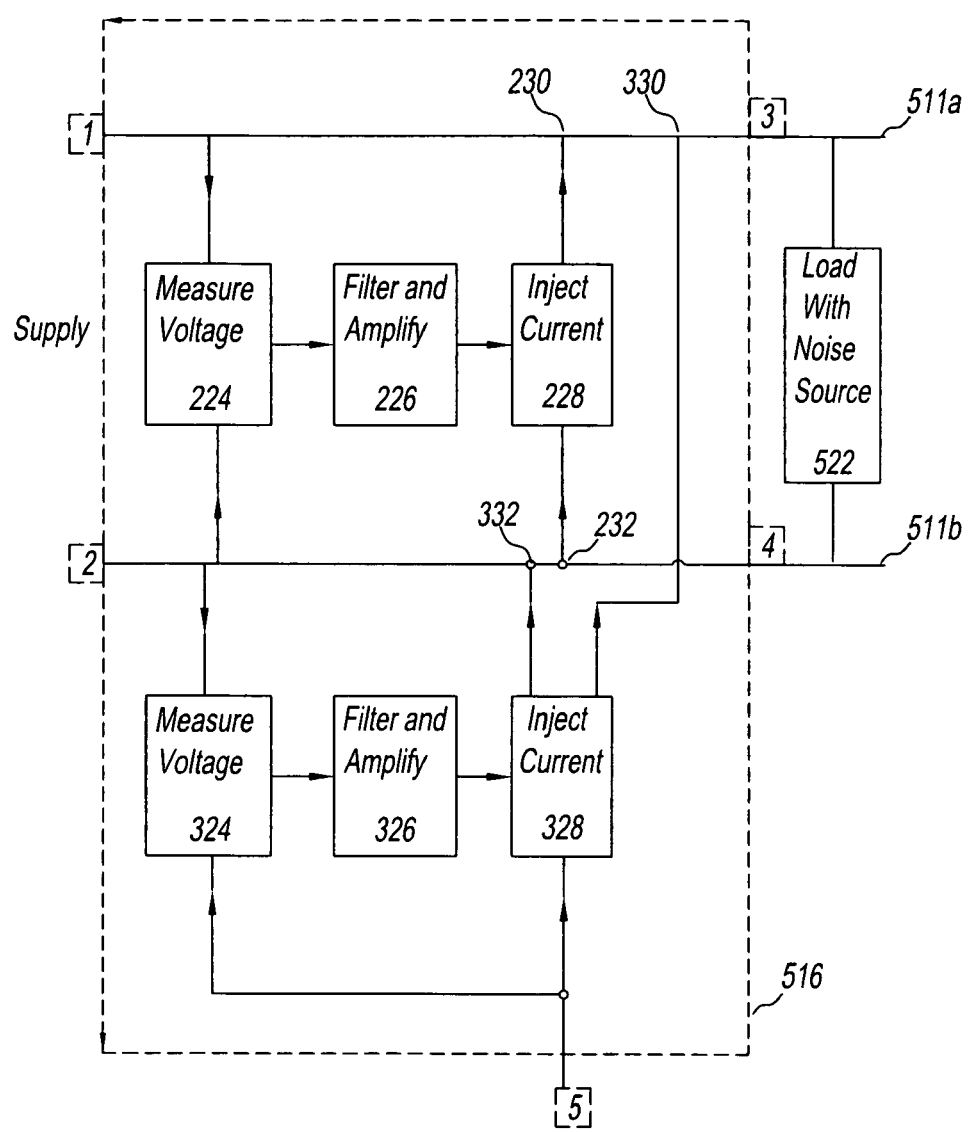
FIG. 9 shows a schematic block diagram of part of the apparatus of FIG. 1 according to a fifth embodiment of the present invention.

FIG. 9 shows a fifth embodiment of the present invention, which is a combination of voltage sensing, using the third embodiment for differential mode noise and the fourth embodiment for common mode noise. The circuitry 516 of the combined third and fourth embodiments is inserted into the apparatus 10 of FIG. 1 as described above. The noise source 522 created by the switching element 19, capacitor 17 and inductors 13 and 15 of FIG. 1 generates noise on the first and second power rails 511*a*, 511*b*. This allows both the common mode and differential mode conducted emissions to be monitored and cancellation currents injected back into the first 511*a* and second 511*b* power rails to reduce the effects of both types of emission. The remaining parts of this embodiment are identical to those of the third and fourth embodiments described above with reference to FIGS. 6 and 7 and have the same reference numerals. They will not be further described here.

Figure 10:
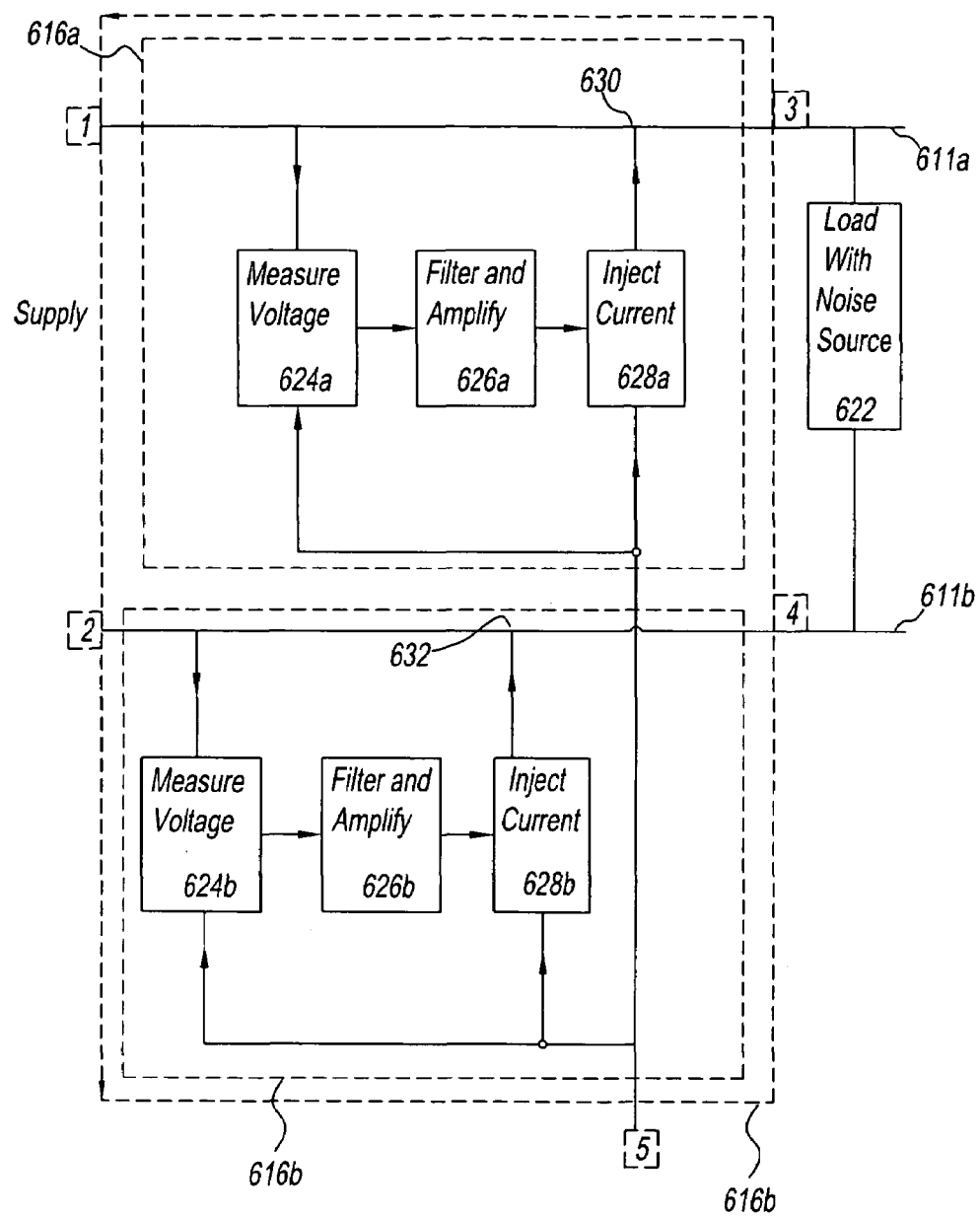
FIG. 10 shows a schematic block diagram of part of the apparatus of FIG. 1 according to a sixth embodiment of the present invention.

FIG. 10 shows a sixth embodiment of the present invention in which the EMC filter 616 is formed by two separate noise cancellation circuits 616*a* and 616*b* applied between ground reference potential and each of the two power rails 611*a* and 611*b*, respectively. The EMC filter 616 is inserted into the apparatus 10 of FIG. 1 as described above, the noise source 622 being created by the switching element 19, capacitor 17 and inductors 13 and 15 of FIG. 1 to generate noise on the first and second power supply rails 611*a*, 611*b*. This method ignores the difference between common mode and differential mode noise and attempts to eliminate the noise emission independently from each power rail 611*a* and 611*b*.

Noise cancellation circuit 616*a* is formed by measurement device 624*a*, which measures voltage between the first power rail 611*a* and ground reference potential. The measurement parameter is passed to a filter 626*a* which substantially blocks any DC element and reduces, if necessary, any AC component to an amplitude level which can be safely passed to a current source 628*a*. The filtered measurement parameter is then used by the current source 628a to generate a cancellation current of substantially the same amplitude but with substantially opposite polarity, 180 degrees difference, to that of the 'switching' noise current, before injecting the cancellation current into the first power supply rail 611a at point 630.

Similarly noise cancellation circuit 616b is formed by measurement device 624b, which measures voltage between the second power rail 611b and ground reference potential. The measurement parameter is passed to a filter 626b which substantially blocks any DC element and reduces, if necessary, any AC component to an amplitude level which can be safely passed to a current source 628b. The filtered measurement parameter is then used by the current source 628b to generate a cancellation current of substantially the same amplitude but with substantially opposite polarity, 180 degrees difference, to that of the 'switching' noise current, before injecting the cancellation current into the second power supply rail 611b at point 632.

Figure 11:
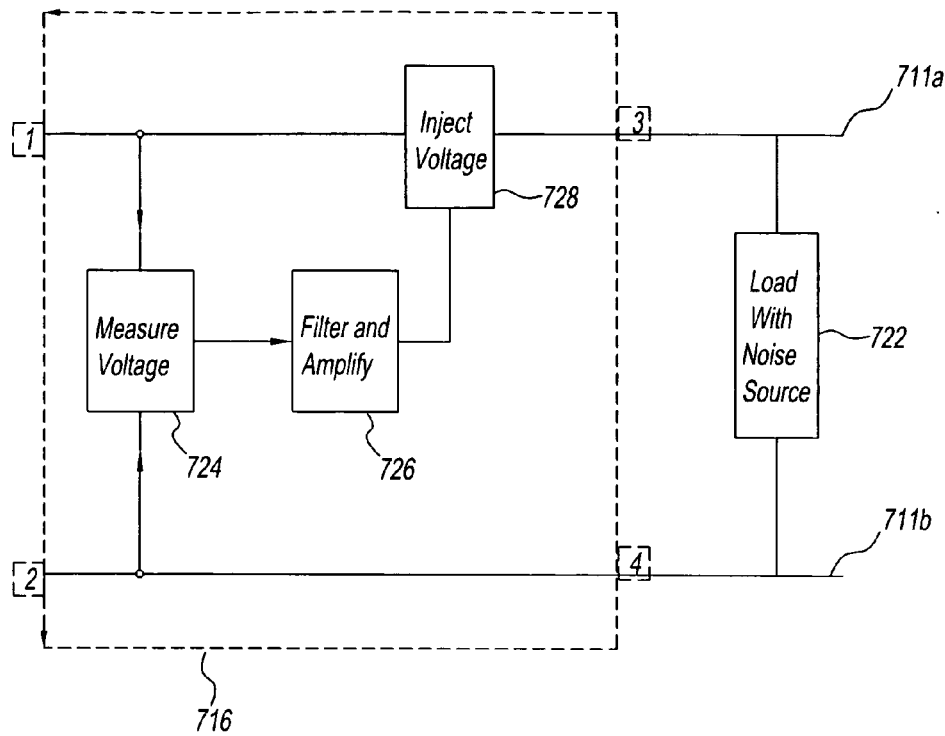
FIG. 11 shows a schematic block diagram of part of the apparatus of FIG. 1 according to a seventh embodiment of the present invention.

FIG. 11 shows a schematic block diagram of a seventh embodiment of an EMC filter 716. This seventh embodiment again utilises closed loop filtering to achieving noise cancellation, although it utilizes voltage injection, rather than current injection. Again, the circuitry forming the EMC filter 716 is inserted into the apparatus 10 of FIG. 1 as described above. The noise source 722 created by the switching element 19, capacitor 17 and inductors 13 and 15 of FIG. 1 generates noise on the first and second power rails 711a, 711b. A measurement device 724 coupled in parallel between the first power rail 711a and the second power rail 711b monitors the voltage between the first power rail 711a and the second power rail 711b and produces a measurement parameter proportional to that measured voltage. The measurement device 724 has an output coupled to a filter 726, which substantially blocks any DC element passing through. The filter 726 also filters and/or amplifies the measurement parameter to a level which can be safely passed to a voltage source 728. This filtering may be achieved passively. The filtered measurement parameter of the noise current is then coupled to the voltage source 728 which generates a cancellation voltage of substantially the same amplitude but with substantially opposite polarity, 180 degrees difference, to that of the voltage that was measured by the measurement device 724. This cancellation voltage is injected back into the first power supply rail 711a at point 730.

The injection of cancellation voltage occurs prior to the point at which the voltage was measured. In this way the effect of adding the cancellation voltage is measured by the measurement device 724, thus creating a feedback loop such that the EMC filter 716 monitors its own effect on the apparatus 10 shown FIG. 1.

Figure 12:
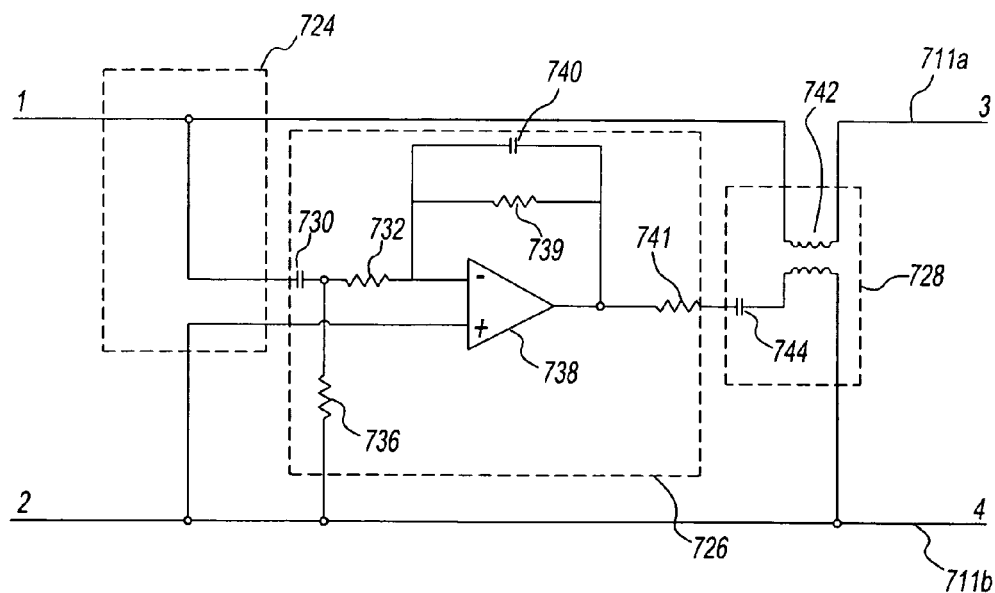
FIG. 12 shows a schematic circuit diagram of an implementation of the part of the apparatus shown in FIG. 11.

FIG. 12 shows a schematic circuit diagram of an example of circuitry implementing the embodiment of FIG. 11. The circuitry forming the EMC filter 716 is inserted into the apparatus 10 of FIG. 1 as described above. The circuitry monitors the noise voltage between the first and second power rails 711a and 711b created by the switching element (19 of FIG. 1). In this case, the first power rail 711a is coupled, via a capacitor 730 and resistor 732 to an inverting input of amplifier 738. A resistor 736 is coupled between the junction between the capacitor 730 and resistor 732 and the second power rail 711b. A non-inverting input of the amplifier 738 is coupled directly to the second power rail 711b. Resistor 739 and capacitor 740 are coupled in parallel between an output of the amplifier 738 and the inverting input (−) thereof to form a feedback loop. The output of the amplifier 738 is coupled, via resistor 741 and capacitor 734, to a primary winding of a transformer 742, whose secondary winding is coupled, in series in the first power rail 711a, so as to inject voltage therein, as described above.

Once again, it will be appreciated that, although in practice the operational amplifier 738 will require a power supply, this has been omitted from FIG. 12 for clarity. Nevertheless, it will be appreciated that the power supply may be derived from the first and second power rails 711a, 711b or from elsewhere. When choosing the operational amplifier 738 it would be desirable to choose one with sufficient bandwidth.

It will be appreciated that although only seven particular embodiments of the invention have been described in detail, various modifications and improvements can be made by a person skilled in the art without departing from the scope of the present invention. For example, although not shown, the various embodiments described above may also include protection devices to improve reliability.

The invention claimed is:

1. An apparatus for providing improved electromagnetic compatibility between a power source and a switching element that switches power supplied from the power source to provide a required frequency power supply, the power source and the switching element being coupled via a first power line at a supply potential and a second power line at a reference potential, the apparatus comprising a measuring device for coupling to at least one of the power lines between the power source and the switching element to provide a first electrical signal proportional to an electrical variable that fluctuates as the switching element switches power received from the power source, and a signal injector coupled to the measuring device and to at least one of the power lines and responsive to said first electrical signal to provide second electrical signal thereto so as to tend to minimize fluctuations in the electrical variable.

2. An apparatus according to claim 1, wherein the electrical variable comprises voltage measured across the first and second power lines.

3. An apparatus according to claim 2, wherein the measuring device comprises a pair of measuring electrodes for coupling between the first and second power lines.

4. An apparatus according to claim 1, wherein the electrical variable comprises voltage measured across the second power line and a ground reference potential.

5. An apparatus according to claim 4, wherein the measuring device comprises a pair of measuring electrodes for coupling between the second power line and ground reference potential.

6. An apparatus according to claim 4, wherein the measuring device and the signal injector comprise an operational amplifier having a pair of inputs for coupling to the second power line and to ground reference potential, respectively, a pair of power inputs for coupling to the first and second power lines, respectively, and an output for coupling to ground reference potential for injecting the electrical signal thereto, thereby drawing power from the power lines in such a manner as to tend to minimize fluctuations in the voltage measured between the second power line and ground reference potential.

7. An apparatus according to claim 1, wherein the electrical variable comprises current measured through a component in the first power line.

8. An apparatus according to claim 6, wherein the measuring device comprises a pair of measuring electrodes for coupling to a pair of electrodes of the component provided in the first power line.

9. An apparatus according to claim 1, wherein the second electrical signal injected into at least one of the power lines comprises voltage.

10. An apparatus according to claim 1, wherein the second electrical signal injected into at least one of the power lines comprises current.

11. A power supply system comprising a power source, a switching element coupled to the power supply via a first power line at a supply potential and a second power line at a reference potential, and an apparatus according to claim 1.

12. A power supply system according to claim 10, further comprising a passive electromagnetic filter provided between the power source and the apparatus.

13. A power supply system according to claim 10, wherein the switching element forms part of a switched mode power supply device.

14. A power supply system according to claim 10, further comprising an inductor provided in the first power line.

15. A method for providing improved electromagnetic compatibility between a power source and a switching element that switches power supplied from the power source to provide a required frequency power, the power source and the switching element being coupled via a first power line at a supply potential and a second power line at a reference potential, the method comprising the steps of providing a first electrical signal proportional to an electrical variable that fluctuates as the switching element switches power received from the power source, and in response to said electrical signal, injecting a second electrical signal into at least one of the power lines so as to tend to minimize fluctuations in the electrical variable.

16. A method according to claim 15, wherein the electrical variable comprises voltage measured across the first and second power lines.

17. A method according to claim 15, wherein the electrical variable comprises voltage measured across the second power line and a ground reference potential.

18. A method according to claim 15, wherein the electrical variable comprises current measured through a component in the first power line.

19. A method according to claim 15, wherein the second electrical signal injected into at least one of the power lines comprises voltage.

20. A method according to claim 15, wherein the second electrical signal injected into at least one of the power lines comprises current.

* * * * *